United States Patent
Simon

(10) Patent No.: US 7,936,173 B2
(45) Date of Patent: May 3, 2011

(54) METHOD FOR DIRECT MEASUREMENT OF THE MIXED-MODE SCATTERING MATRIX WITH A VECTORIAL NETWORK ANALYZER

(75) Inventor: Jochen Simon, Wolfratshausen (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 312 days.

(21) Appl. No.: 12/159,028

(22) PCT Filed: Jun. 18, 2007

(86) PCT No.: PCT/EP2007/005354
§ 371 (c)(1),
(2), (4) Date: Jun. 24, 2008

(87) PCT Pub. No.: WO2008/003398
PCT Pub. Date: Jan. 10, 2008

(65) Prior Publication Data
US 2008/0278177 A1   Nov. 13, 2008

(30) Foreign Application Priority Data
Jul. 5, 2006   (DE) .......................... 10 2006 031 045
Dec. 22, 2006   (DE) .......................... 10 2006 061 144

(51) Int. Cl.
G01R 27/00   (2006.01)
G01D 18/00   (2006.01)
(52) U.S. Cl. ............................ 324/637; 324/600; 702/85
(58) Field of Classification Search .................. 324/637, 324/600; 702/85
See application file for complete search history.

(56) References Cited

U.S. PATENT DOCUMENTS

| 5,495,173 A | 2/1996 | Bockelman et al. |
| 2004/0196051 A1 | 10/2004 | Dunsmore et al. |
| 2004/0196083 A1 | 10/2004 | Dunsmore |
| 2004/0201383 A1 * | 10/2004 | Anderson ..................... 324/600 |

FOREIGN PATENT DOCUMENTS

| DE | 35 12795 C1 | 10/1996 |
| DE | 197 57 675 C2 | 6/1999 |
| DE | 199 18 697 A1 | 11/1999 |
| DE | 199 18 960 B4 | 11/1999 |

(Continued)

OTHER PUBLICATIONS

International Preliminary Report on Patentability, PCT/EP2007/005354, Jan. 29, 2009, pp. 1-7.

(Continued)

Primary Examiner — Melissa J Koval
Assistant Examiner — Farhana Hoque
(74) Attorney, Agent, or Firm — Ditthavong Mori & Steiner, P.C.

(57) ABSTRACT

In a method for the excitation of port groups of a multi-port device under test with coherent incident waves of the same frequency, which provide defined amplitude ratios and phase differences within each port group, the waves are generated respectively by one signal generator of a vectorial network analyzer per test port. The network analyzer has unbalanced test ports. A system-error correction of the unbalanced incident and reflected waves with reference to the ports of the device under test is implemented in order to obtain corrected waves. The amplitude and phase changes required in the signal generators to fulfill the desired amplitude and phase conditions are calculated from these corrected waves.

20 Claims, 9 Drawing Sheets

FOREIGN PATENT DOCUMENTS

| | | |
|---|---|---|
| DE | 199 19 592 A1 | 11/2000 |
| DE | 103 57 243 A1 | 11/2004 |
| DE | 103 57 244 A1 | 11/2004 |
| EP | 1 455 197 A2 | 9/2004 |

OTHER PUBLICATIONS

David E. Bockelman et al.; "Calibration and Verification of the Pure-Mode Vector Network Analyzer", IEEE Transactions on Microwave Therory and Techniques, IEEE Service Center, Piscataway, NJ, US, vol. 46, No. 7 Jul. 1998 XP011037203 ISSN: 0018-9480.

David E. Bockelman et al.; "Combine Differential and Common-Mode Scattering Parameters: Theory and Simulation"; IEEE Transactions on Microwave Theory and Techniques; vol. 43, No. 7, Jul. 1995; XP002452336 ISN: 0018-9480.

Dunsmore J. Ed-Thal H (ED) Institute of Electrical and Electronics Engineers: "New Methods & non-linear measurements for active differenctial devices"; 2003 IEEE MTT-S International Microwave Symposium Digest. (IMS 2003). Philadelphia, PA, Jun. 8-13, 2003; IEEE MIT-S International Microwave Symposium, New York, NY: IEEE, US, vol. 3 of 3, Jun. 8, 2003, XP010746678; ISBN: 0-7803-7698-1.

David E. Bockelman et al.; "Pure-Mode Network Analyzer for On-Wafer Measurements of Mixed-Mode S-Parameters of Differential Circuits"; IEEE Transactions on Microwave Theory and Techniques, IEEE Service Center, Piscataway, NJ, US; vol. 45, No. 7, Jul. 1997, XP011036856 ISSN: 0018-9480.

Fan W. et al.; "Mixed-mode S-parameter characterization of differential structures"; Electronics Packing Technology, 2003 $5^{th}$ Conference (EPTC 2003) Dec. 10-12, 2003; Piscataway, NJ, USA, IEEE Dec. 10, 2003; XP010687350 ISBN: 0-7803-8205-6.

Pfeiffer U.R. et al.; "Pure-Mode Network Analyzer Concept for On-Wafer Measurements on Differnectial Circuits at Millimeter-Wave Frequencies"; IEEE Transactions on Microwave Theory and Techniques, IEEE Service Center, Piscataway, NJ, USA, vol. 53, No. 3, Mar. 2005; XP011128141 ISSN: 0018-9480.

\* cited by examiner

METHOD FOR DIRECT MEASUREMENT OF THE MIXED-MODE SCATTERING MATRIX WITH A VECTORIAL NETWORK ANALYZER

CROSS-REFERENCE TO RELATED APPLICATION

The present application claims priority to PCT Application No. PCT/EP2007/005354, filed on Jun. 18, 2007, which claims priority to DE102006061144.6 filed Dec. 22, 2006 and DE102006031045.4 filed Jul. 5, 2006, the entire contents of which are herein incorporated by reference.

BACKGROUND OF THE INVENTION

1. Field of the Invention

The invention relates to a method for direct measurement of the mixed-mode scattering matrix with a vectorial network analyzer (also referred to below as VNA).

2. Discussion of the Background

Lines conventionally used for the transmission of electrical signals generally comprise two separate conductors. In the past, these lines were generally unbalanced, that is to say, one conductor is disposed at earth or ground potential. With an earthed, unbalanced line, only one wave mode is generally capable of propagation. More recently, however, signals have also increasingly been transmitted via balanced-to-earth lines. In a balanced-to-earth line, also referred to as a balanced line, both conductors are detached from the ground potential. Accordingly, two fundamental modes are capable of propagation, namely the differential mode and the common mode. In the differential mode, which is preferred for signal transmission, the earthed signal voltages of the two conductors have the same amplitude but opposing phases. By contrast, in the common mode, not only the amplitudes but also the phases of the earthed, single-conductor modes are the same. Each physically-possible wave mode can be described as a linear combination of differential mode and common mode.

By comparison with that of earthed signals, the transmission of differential-mode signals has the advantages that, on the one hand, any interference signals, which may be present in the earth, are not added to the useful signal, from which they can no longer be separated, and, on the other hand, because of its symmetry, the line radiates a small interference-signal field. In view of the increasing spread of differential-mode transmission, electrical components with balanced ports are increasingly manufactured.

It is conventional to use network-analyzers to measure the electrical properties of components at higher frequencies. The primary test parameters of network analyzers are scattering (S-) parameters, which describe the transmission and reflection behaviour of a component, which will be referred to below as the device under test (MO). A vectorial network analyzer (VNA) provides the S-parameters as complex values, that is to say, with modulus and phase information. The complex S-parameters can be converted into further descriptive parameters of the device under test (MO), for example, Z-parameters, Y-parameters or group delay time.

However, commercially-available vectorial network analyzers have at their disposal only unbalanced (also referred to as nodal) test ports, to which the balanced ports of a device under test (MO) cannot be connected directly. It is therefore conventional to connect each of the two poles of a balanced device port to the pole conducting the signal voltage, that is to say, generally, to the inner coaxial conductor of an unbalanced VNA test port. Provided the device under test (MO) behaves in a linear manner, it is possible to measure the unbalanced S-parameters of the device under test (MO) with the unbalanced VNA, and then to convert these into balanced S-parameters. A conversion process of this kind is described in the specialist article by D. E. Bockelman, W. R. Eisenstadt: "Combined Differential and Common-Mode Scattering Parameters: Theory and Simulation", IEEE Transactions on Microwave Theory and Techniques, Volume 43, No. 7, July 1995, pp. 1530-1539. The S-parameters of a device under test (MO), which provides balanced ports, are also described as mixed-mode parameters. This description results from the fact that the scattering matrix of a device under test with balanced ports describes the transmission between incoming and outgoing differential-mode and common-mode waves. If unbalanced ports are added, the transmission functions between three different modes are contained in the mixed-mode S-matrix. For example, the mixed-mode S-matrix $S_M$ of a filter with unbalanced input at port 1 and balanced output at port 2 provides the 9 elements presented below:

$$S_M = \begin{pmatrix} S_{ss11} & S_{sd12} & S_{sc11} \\ S_{ds21} & S_{dd22} & S_{dc22} \\ S_{cs21} & S_{cd22} & S_{cc22} \end{pmatrix} \quad (1)$$

The element index s (single ended) denotes the unbalanced mode of port 1; d (differential) denotes the differential-mode and c (common) denotes the common mode of port 2.

Active devices under test with balanced ports, such as differential-mode amplifiers, can provide nonlinear behaviour. In this case, the transmission functions for common-mode waves and differential-mode waves cannot be obtained by linear superposition of the transmission functions for unbalanced waves. On the contrary, for devices under test of this kind, appropriate VNAs must be capable of generating a genuine balanced excitation signal (stimulus signal).

A VNA for devices under test with two balanced ports is disclosed, for example, in the U.S. Pat. No. 5,495,173 B1. In this context, the device under test is supplied alternately in the transmission and reflection direction with a differential-mode and a common-mode generator signal. These signals are generated using hybrid circuits. The disadvantage in this context is that maintaining the amplitude and phase conditions for pure differential-mode and common-mode signals is dependent upon the ideality of the hybrid circuits. Sufficiently-good properties can be realized with circuits of this kind only over a relatively-limited frequency range, wherein a maximum ratio between the lower and upper frequency limit of approximately 1:8 can be achieved. Furthermore, all of the circuit components behind the hybrids must provide the most identical transmission behaviour possible, so that the adjusted amplitude and phase ratio is maintained through to the test ports. The specialist article by D. E. Bockelman, W. R. Eisenstadt: "Calibration and Verification of the Pure-Mode Vectorial Network Analyser", IEEE Transactions on Microwave Theory and Techniques, Volume 46, No. 7, July 1998, pages 1009 to 1012 discloses a method, in which the balanced parameters are measured with a non-ideal measuring device according to U.S. Pat. No. 5,495,173 B1 and then corrected with the assumption of linear behaviour of the device under test. However, if the device under test behaves in a nonlinear manner, this method cannot be used.

US patent specifications US 2004/0196083 A1 and US 2004/0196051 A1 or respectively the German published application DE 103 57 243 A1 corresponding to US 2004/0196083 A1 provide a solution to the problem of generating the most ideal differential-mode and common-mode signals possible over a broad frequency range. FIG. 1 shows the structure of a dual-output high-frequency signal source (DOHFSS) according to this related art. A signal generator 101, which can be either an independent device or an integral component of a two-port VNA, generates a high-frequency signal. This signal is split into two paths using a signal divider 102. In one of the two paths, signal amplitude and phase can be adjusted using a vector modulator 112 via the I/Q control inputs 113, 114. In order to adjust the desired amplitude and phase difference in the reference planes 105, 106 of the DOHFSS, the incident and reflected waves are measured via coupling four-port devices 103, 104 and measuring points 107 to 110. According to US 2004/0196051 A1, the calibration of the VNA is implemented with a common-mode signal, which is generated using a signal divider. After the calibration of the VNA, the DOHFSS is calibrated in such a manner that the vectorial modulator moves in small phase increments, for example, nominal 1°, through the range from 0° to 360°. Because of the non-idealities, the actually-generated phase increments deviate from the nominal value. The actual phases are measured using the VNA and entered in the correction table. A phase value to be adjusted nominally in the vectorial modulator can then be assigned for each desired phase difference of the DOHFSS using this table.

SUMMARY OF THE INVENTION

The above disclosed method provides several weaknesses. On the one hand, a signal divider is required for the calibration of the VNA. The quality of this calibration therefore depends substantially upon the properties of the signal divider. Non-idealities of this component, such as imbalances, ultimately lead to amplitude and phase deviations of the DOHFSS signal. Furthermore, a signal divider is not a conventional accessory of a VNA and must therefore possibly be additionally purchased. On the other hand, the disclosed method does not take into consideration that a device under test connected to the DOHFSS can couple the two signal branches of the DOHFSS with one another and can therefore change the relationship set down in the correction table between the nominal and the actual phase difference. The two named problems are resolved by a method according to an embodiment of the present invention.

However, the object to be achieved, namely, a determination of elements of the mixed-mode matrix, is not achieved in full by generating a stimulus signal for a balanced device under test. The incident-wave and reflected-wave parameters must also be measured in differential mode and common mode. The measuring method according to an embodiment of the present invention can also achieve such an object.

It is known that VNAs for measuring the scattering parameters of unbalanced devices under test can be subjected to a system-error calibration (SFK), thereby considerably reducing the uncertainty of the test. An appropriate method in this context is disclosed, for example, in the German patent specification DE 35 12 795 C2. This method relates to a two-port VNA with two complex measuring points per port. As shown in DE 199 18 960 B4, the method can also be used in a similar manner for VNAs with more than two measuring points. However, for reasons of clarity, a two-port VNA will be assumed by way of example in paragraphs below.

FIG. 2 shows the schematic structure of a two-port VNA with two complex measuring points per port. A signal source 201 supplies one of the test ports 205 or 206 alternately using a signal-path switch 202. Test signals for the incident and reflected waves are decoupled at the first test port 205 and the second test port 206 via the four-port devices $V_G$ 203 and $V_H$ 204 and tested at the measuring points 207 to 210. Subject to the marginal condition that the sensitivities and reflection factors of the measuring points 207 to 210 and the reflection factors of the signal-path switch 202 observed from the four-port devices are time-invariant and independent of the device under test, the four-port devices $V_G$ and $V_H$ can be reduced—as shown in FIG. 3—to two-port devices $Z_G$ 303 and $Z_H$ 304, which represent all of the linear system errors of the two-port VNA. The transmission matrices of these error two-port devices link the incident and reflected waves $a_1$, $b_1$ and respectively $a_2$, $b_2$ actually present at the test ports to the complex parameters $m_1$, $m_2$, $m_3$ and $m_4$ measured by the VNA. The matrix G is obtained by line transposition from the transmission matrix of $Z_G$, and H is obtained by column transposition from the transmission matrix of $Z_H$. The following relationships apply:

$$\begin{pmatrix} b_1 \\ a_1 \end{pmatrix} = G \begin{pmatrix} m_1 \\ m_2 \end{pmatrix} = \begin{pmatrix} G_{11} & G_{12} \\ G_{21} & G_{22} \end{pmatrix} \cdot \begin{pmatrix} m_1 \\ m_2 \end{pmatrix} \quad (2)$$

$$\begin{pmatrix} a_2 \\ b_2 \end{pmatrix} = H \begin{pmatrix} m_3 \\ m_4 \end{pmatrix} = \begin{pmatrix} H_{11} & H_{12} \\ H_{21} & H_{22} \end{pmatrix} \cdot \begin{pmatrix} m_3 \\ m_4 \end{pmatrix} \quad (3)$$

Scaled versions of the matrices G and H are sufficient for the system-error correction of S-parameters, which are, of course, quotients of wave parameters. In order to reduce the number of unknown error terms, it is expedient to scale to one of the matrix elements, and, in fact, to one which does not become zero with an ideal VNA. The element $H_{21}$, for example, is available for this purpose. Accordingly, the equations (2) and (3) are transformed as follows:

$$c \cdot \begin{pmatrix} b_1 \\ a_1 \end{pmatrix} = \begin{pmatrix} b_{1n} \\ a_{1n} \end{pmatrix} = G_n \cdot \begin{pmatrix} m_1 \\ m_2 \end{pmatrix} = \begin{pmatrix} G_{11n} & G_{12n} \\ G_{21n} & G_{22n} \end{pmatrix} \cdot \begin{pmatrix} m_1 \\ m_2 \end{pmatrix} \quad (4)$$

$$c \cdot \begin{pmatrix} a_2 \\ b_2 \end{pmatrix} = \begin{pmatrix} a_{2n} \\ b_{2n} \end{pmatrix} = H_n \cdot \begin{pmatrix} m_3 \\ m_4 \end{pmatrix} = \begin{pmatrix} H_{11n} & H_{12n} \\ 1 & H_{22n} \end{pmatrix} \cdot \begin{pmatrix} m_3 \\ m_4 \end{pmatrix} \quad (5)$$

wherein $$c = \frac{1}{H_{21}}$$

thereby leaving 7 error terms. The calibration methods, with which the error terms $G_{ijn}$ and $H_{ijn}$ can be determined by connecting partially-known or completely-known calibration standards, are therefore also referred to as 7-term calibration methods. These include, for example, the TRL, TRM, TOM and TNA methods.

However, the parameters $G_{ijn}$ and $H_{ijn}$ can also be determined using the known 10-term calibration method often referred to as the TOSM-method or SOLT-method. The system-error terms transmission synchronisation $T_{ji}$ from port i to j and reflection synchronisation $RT_i$, directivity $D_i$ and source-port adaptation $SM_i$ at port i obtained in this context can be converted into scaled G-parameters and H-parameters via the following relationships:

$$G_n = \frac{TT_{21}}{RT_1} \cdot \begin{pmatrix} -D_1 & 1 \\ RT_1 - D_1 \cdot SM_{11} & SM_{11} \end{pmatrix}$$

and $$H_n = \begin{pmatrix} SM_{22} & RT_2 - D_2 \cdot SM_2 \\ 1 & -D_2 \end{pmatrix}$$

With more than two test ports, the 10-term-parameters must be provided for this purpose in a uniformly-scaled form. This is achieved, for example, with a calibration method according to DE 199 18 697 A1.

The invention therefore advantageously provides a method for direct measurement of the mixed-mode scattering matrix with improved accuracy.

The invention is based on the idea that a system-error correction of the unbalanced incident and reflected waves must initially be implemented in order to obtain corrected waves, and, from these corrected waves, the amplitude and phase changes required in the signal generators to fulfill the desired amplitude and phase conditions must then be calculated and implemented. The method becomes substantially more efficient as a result of the preceding system-error correction before the calculation of the amplitude and phase changes.

If the two unbalanced ports of a DOHFSS in the network analyzer are not coupled to one another via the device under test, the necessary amplitude and phase changes of the signal generators can be calculated directly from the deviations of the amplitudes and phases. If the test ports are coupled, the procedure is more complicated. In this case, the complex component, of which the modulus and phase are dependent respectively only upon a signal generator associated with the port group, must first be determined for each incident, balanced wave associated with a coupled DOHFSS, before the overall vector of the amplitude and phase change necessary as a whole, which also contains the coupling, is calculated. In this context, a procedure, wherein the phase settings are rotated through 180°, and the moduli and phases of the partial vectors are determined from the resulting maxima and minima, is advantageous.

The accuracy of the solution determined in this context can be improved by linearization and variation by means of linear interference terms in accordance with interference theory. An iterative procedure is also possible.

BRIEF DESCRIPTION OF THE DRAWINGS

An exemplary embodiment of the invention is described in greater detail below with reference to the drawings. The drawings are as follows.

DETAILED DESCRIPTION OF EXEMPLARY EMBODIMENTS OF THE INVENTION

The relationships (4) and (5) and the 7-term calibration method were originally developed for correcting system errors in the context of scattering-parameter measurements with a VNA. However, as will be shown below, they can also be used for system-error calibration of mixed-mode measurements.

A two-port VNA with two coherent sources can be used according to US 2004/0196083 A1 as a DOHFSS for generating differential-mode or common-mode signals. In general, it is also possible to adjust any required amplitude ratio and any required phase difference for the two sources. The sources can be realized, as in the case of US 2004/0196083 A1, in such a manner that a common original signal is split into two paths, and the amplitude and phase can be changed in one or both paths using vector modulators. However, two independent sources, which are normally operated at the same frequency and of which the coherence is secured, for example, by a phase-locked loop, can also be used. If the frequency of at least one source can be displaced for a time $\Delta t$ by an offset $\Delta f$, this allows a defined rotation of the phase of this source by $\Delta f \cdot \Delta t \cdot 360°$ relative to the other source.

Figure 4:
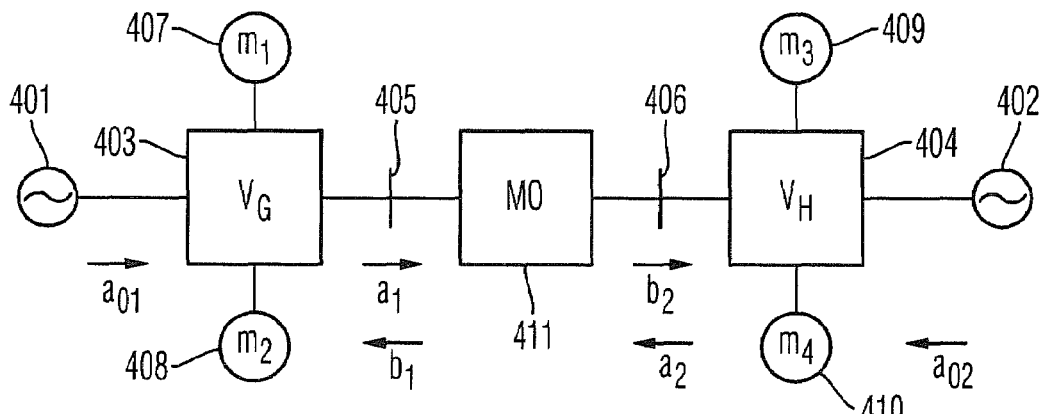
FIG. 4 shows the structure of the two-port VNA with two independent signal sources and two complex measuring positions per port.

FIG. 4 shows a two-port VNA of this kind. It is assumed that the amplitude and phase of the source 401 can be changed relative to the source 402. The error matching of the sources 401 and 402 can be added to the coupling four-port devices $V_G$ 403 and $V_H$ 404. The amplitude and phase of the "original" waves $a_{01}$ and $a_{02}$ travelling from the sources to the four-port devices are therefore dependent only upon the sources themselves and are therefore free from any reaction from the four-port devices $V_G$ and $V_H$.

Figure 1:
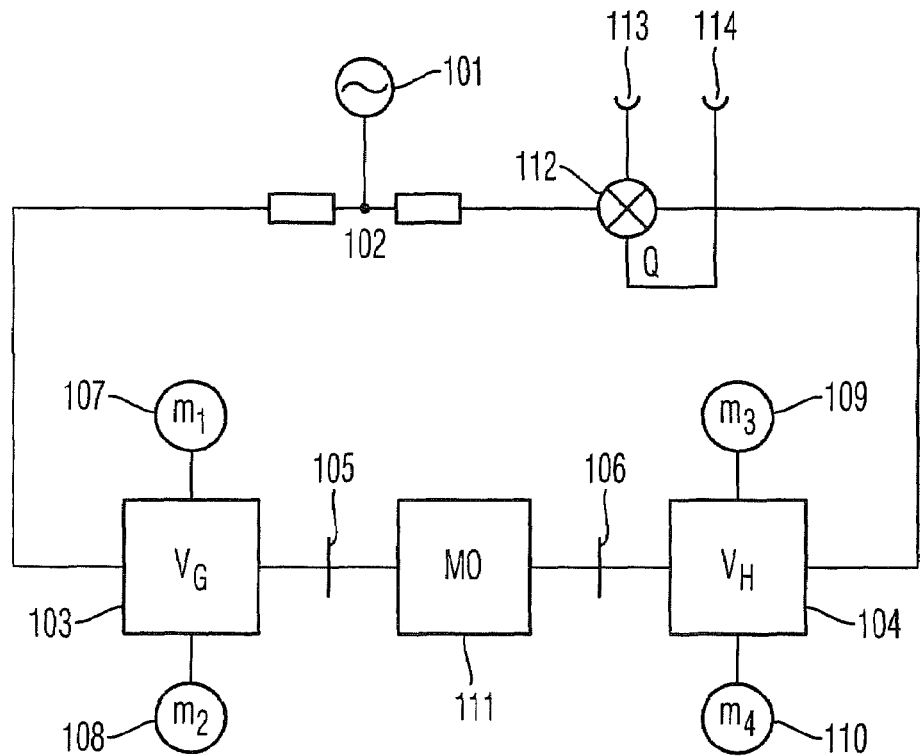
FIG. 1 shows a dual-output high-frequency signal source (DOHFSS) according to the related art.
Figure 2:
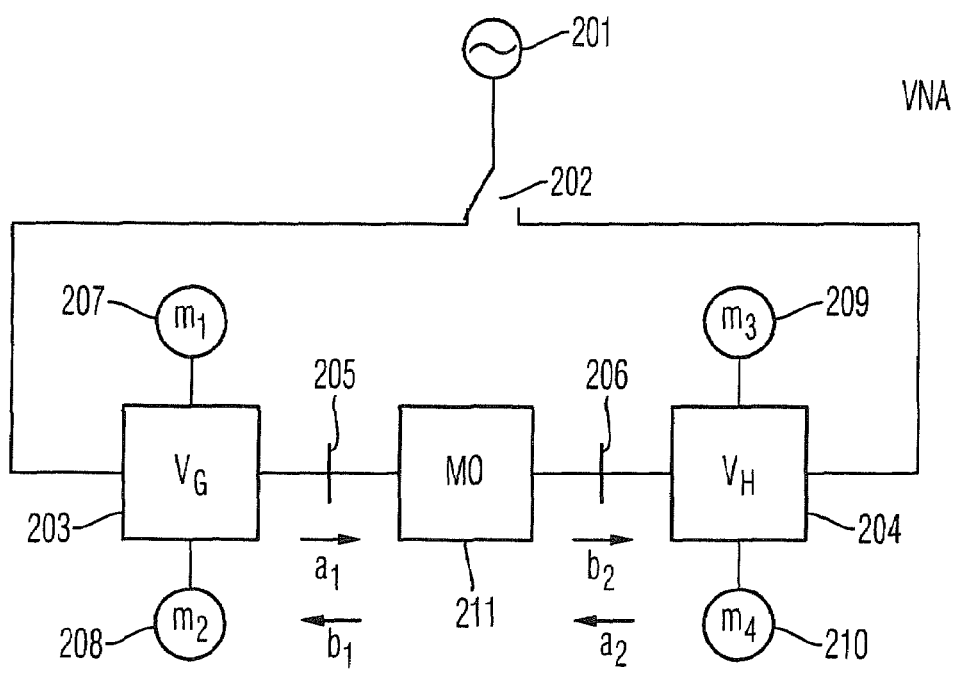
FIG. 2 shows the structure of a two-port vectorial network analyzer with two complex measuring positions per port.
Figure 3:
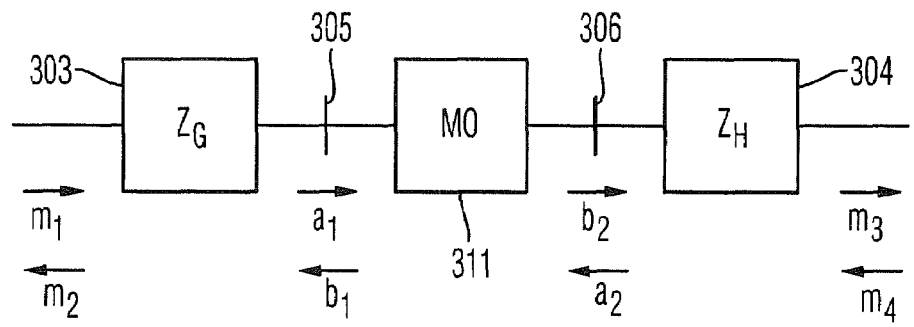
FIG. 3 shows the system-error model of two-port VNA according to FIG. 2.

System errors according to FIG. 3 can also be modelled with this VNA. The error terms, that is to say, the elements of the modified and scaled transmission matrices $G_n$ and $H_n$ in (4) and (5) can therefore also be determined with a 7-term calibration method. Knowledge of these error terms allows the calculation of the current, scaled, unbalanced waves $a_{1n}$ and $b_{1n}$ from the complex measured values $m_1$ and $m_2$ and respectively of the waves $a_{2n}$ and $b_{2n}$ from $m_3$ and $m_4$:

$$a_{1n} = G_{21n} \cdot m_1 + G_{22n} \cdot m_2 \tag{6}$$

$$b_{1n} = G_{11n} \cdot m_1 + G_{12n} \cdot m_2 \tag{7}$$

$$a_{2n} = H_{11n} \cdot m_3 + H_{12n} \cdot m_4 \tag{8}$$

$$b_{2n} = H_{21n} \cdot m_3 + H_{22n} \cdot m_4 \tag{9}$$

The desired amplitude ratio and the desired phase difference can be specified for the waves travelling towards the device under test and also for the scaled port voltages $U_{1n}$ and $U_{2n}$. The port voltages can be calculated via the relationship $U_{in} = a_{in} + b_{in}$ from the incident and reflected waves of the port i. The following relationships apply:

$$U_{1n} = (G_{11n} + G_{21n}) \cdot m_1 + (G_{12n} + G_{22n}) \cdot m_2 \tag{10}$$

$$U_{2n} = (H_{11n} + 1) \cdot m_3 + (H_{12n} + H_{22n}) \cdot m_4 \tag{11}$$

Since scaled and un-scaled waves or respectively voltages differ from one another only with reference to one factor, the target values for amplitude ratio and phase difference also apply for the un-scaled parameters in the same manner as for scaled parameters. In order to simplify the formulation, the index n referring to the scaling is therefore omitted in the paragraphs below. Moreover, equations (6) to (11) show that the linear relationship between measured parameters on the one hand and incident waves or respectively voltages on the other hand is formally identical. Only the correction coefficients differ. Accordingly, a separate observation of incident waves and voltages is not required. These are summarised in the paragraphs below under the superordinate term object parameters, that is to say, parameters for which a given $A_w$ and $\Delta\phi_w$ is to be set. The character used in the formulae for these parameters will be q. After switching on, the DOHFSS is disposed in condition I. In this condition, the amplitude ratio is:

$$A_I = \left|\frac{q_{2I}}{q_{1I}}\right|$$

and the phase difference $$\Delta\phi_I = \arg(q_{2I}) - \arg(q_{1I}) = \phi_{2I} - \phi_{1I}$$

The desired amplitude ratio is $$A_w = \left|\frac{q_{2w}}{q_{1w}}\right| \quad (12)$$

and the desired phase difference is $$\Delta\phi_w = \arg(q_{2w}) - \arg(q_{1w}) = \phi_{2w} - \phi_{1w} \quad (13)$$

Figure 5:
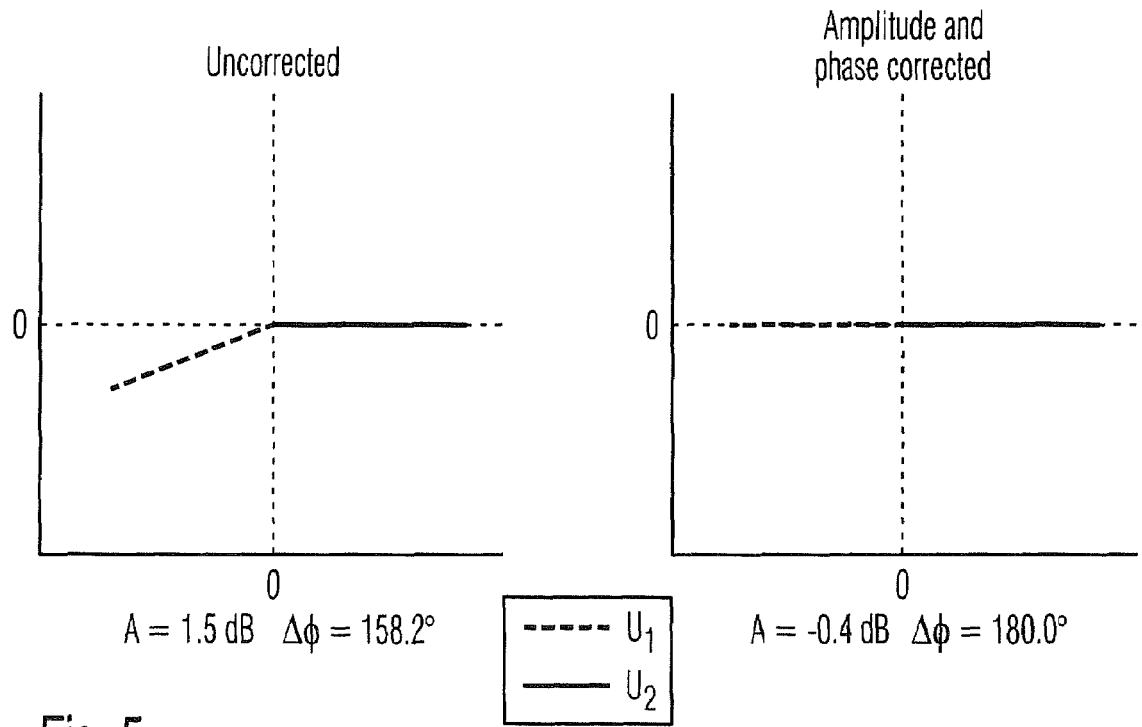
FIG. 5 shows the phasor of the unbalanced voltages of an un-coupled DOHFSS before and after correction.
Figure 6:
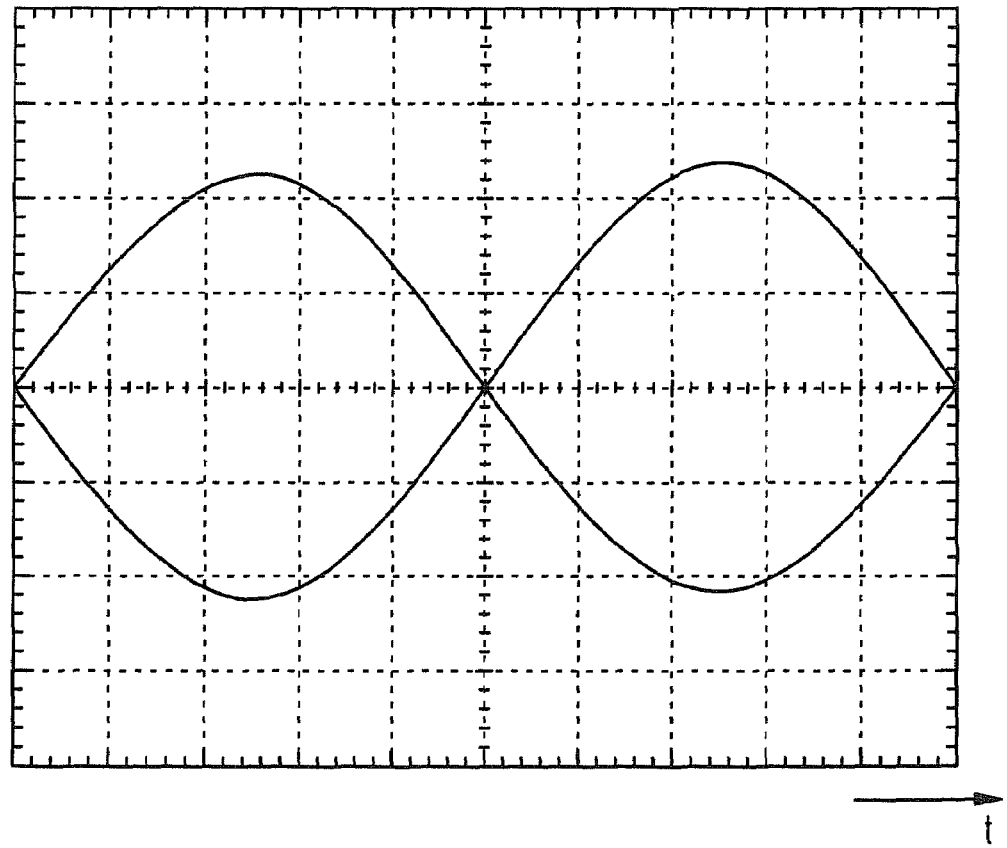
FIG. 6 shows the time characteristic of the unbalanced voltages of an un-coupled DOHFSS after correction.

By way of simplification, it will initially be assumed that the two sources are not coupled to one another via the device under test. Accordingly, the object parameters $q_1$, $q_2$ at the two ports are directly proportional to the "original" values $q_{01}$ and $q_{02}$ generated by the respective generators. In order to move from condition I to the desired final condition, the amplitude of the signal from the source 401 must be multiplied by the factor $$c_{01} = \frac{A_w}{A_I}$$

and the offset $$\Delta\phi_{01} = \Delta\phi_w - \Delta\phi_I$$

must be added to its phase. FIG. 5 shows the measured, unbalanced voltage phasors $U_1$ and $U_2$ of an un-coupled DOHFSS before and after the correction according to the method of the invention. $A_w = 1$ and $\Delta\phi_w = 180°$ are specified as set values, in other words, a pure differential-mode signal. The signal frequency is 100 MHz. FIG. 6 shows the measured time characteristic of $U_1$ and $U_2$ after the correction.

In order to establish the amplitude ratio A and phase difference $\Delta\phi$ of the object parameters, the method according to the invention differs from the related art in that it does not require an auxiliary three-port device (for example, a signal divider). A conventional system-error calibration is sufficient. The uncertainty in the measurement of A and $\Delta\phi$ depends substantially upon the uncertainty of the system-error correction data. This is generally significantly lower than the uncertainty regarding the balancing of a signal divider, especially over a large frequency range. Signal dividers with a narrow tolerance with reference to balancing properties are expensive and, by contrast with calibration units, are not among the standard accessories of a vectorial network analyzer VNA. If a sweep is carried out over the frequency, and $\Delta\phi_I$ provides an initially arbitrary value at every measuring point in repeated sweeps, correction according to the related art is completely impracticable, because the device under test MO would have to be removed, and the signal divider would have to be connected at every measuring point. In the case of the method according to the invention, since the correction values need only be recorded once, and the actual correction is based only on the measurement of the current incident waves and reflected waves of the device ports, it can be used even under these more difficult conditions.

The method described can, in principle, also be used with signal sources, which provide more than two unbalanced outputs. The object parameter of a port is given as a reference, to which the desired amplitude ratios and phase differences for the other ports relate. In this case, the correction of the waves is based on a previously-implemented, uniformly-scaled, multi-port system-error calibration.

Figure 7:
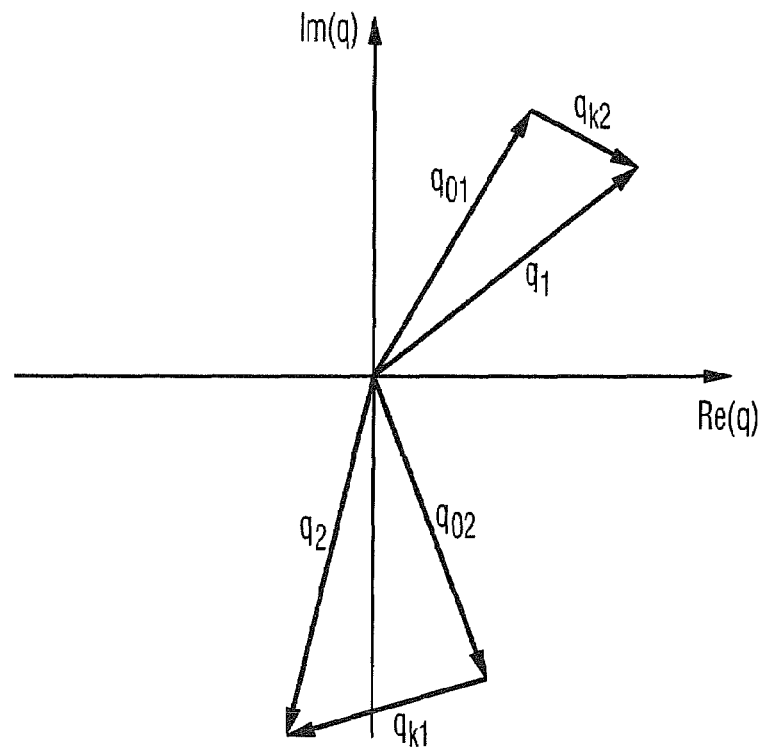
FIG. 7 shows complex phasors of the object parameters composed of partial components.

In general, the object parameters are not independent of one another, but coupled via the device under test MO. The case of two coupled ports will be considered by way of example. As shown in FIG. 7, the object parameters $q_1$ and $q_2$ are composed respectively of two partial vectors. The following equations apply:

$$q_1 = q_{01} + q_{k2} \quad (14)$$

and $$q_2 = q_{02} + q_{k1} \quad (15)$$

The parameter $q_1$ provides a component $q_{01}$, generated by the source 401, of which the amplitude and phase are proportional to the amplitude and phase of the original wave $a_{01}$ of this source. However, it can also over-couple the signal generated by the source 402 via the device under test 411 to the port 405, where it is reflected at the four-port device 403. The reflection takes place only at the four-port device 403, because—as already mentioned—an ideal matching of the source 401 is assumed. The component $q_{k2}$ over-coupled from port 2 is dependent only upon the amplitude and phase of the source 402.

Figure 8:
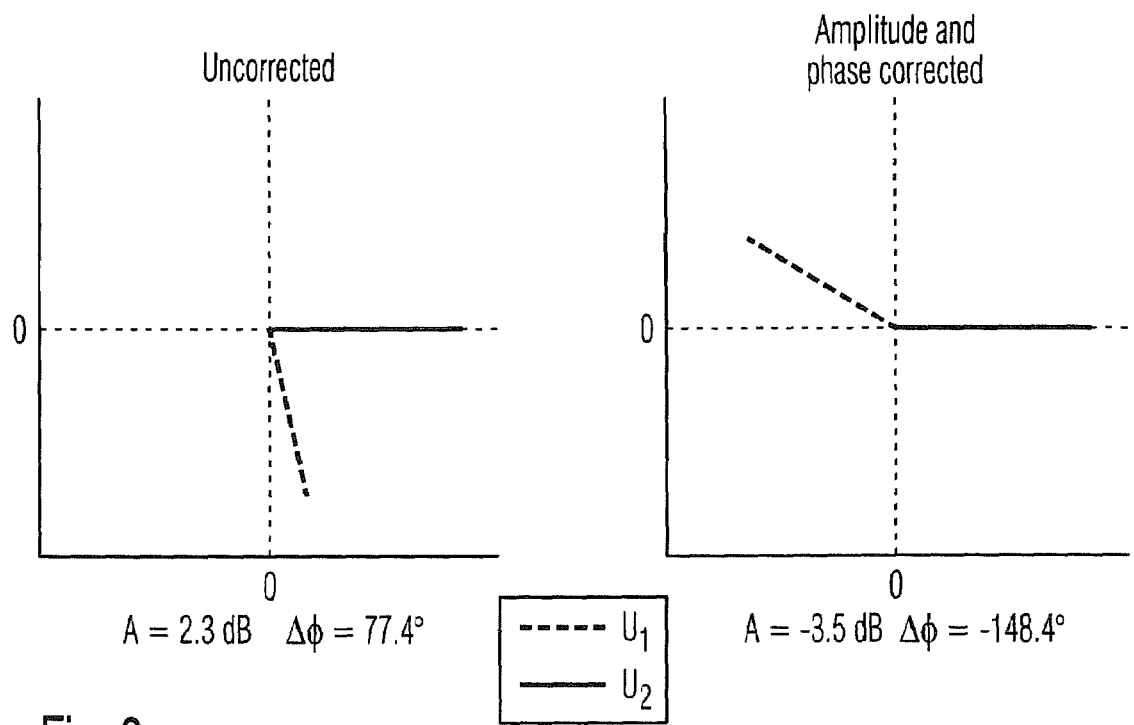
FIG. 8 shows the phasor of the unbalanced voltages of a DOHFSS coupled via a signal divider before and after the correction for an un-coupled DOHFSS.
Figure 9:
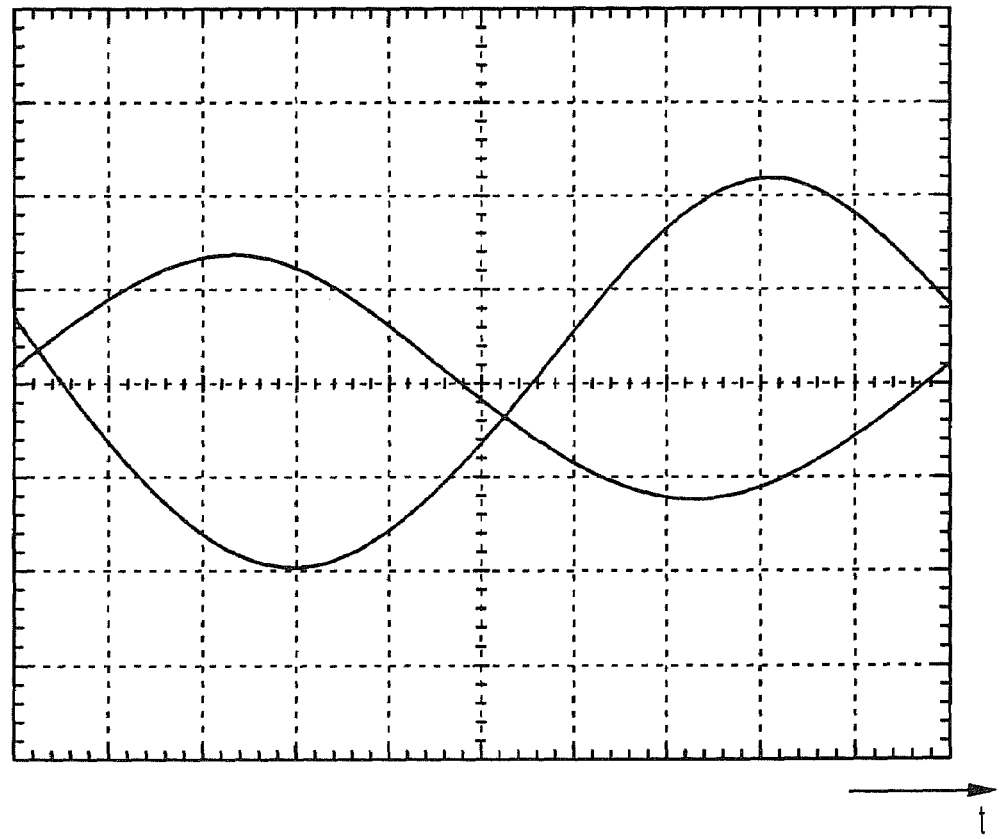
FIG. 9 shows the time characteristic of the unbalanced voltages of a DOHFSS coupled via a signal divider after the correction for an un-coupled DOHFSS.

Unsatisfactory results are generally obtained, if the method described in the introduction for un-coupled DOHFSSs is used for a coupled DOHFSS. FIG. 8 shows the measured, complex voltage phasors $U_1$ and $U_2$ for the frequency 100 MHz of a DOHFSS coupled via a signal divider, before and after it has been corrected according to the method described above for un-coupled DOHFSSs. The frequency and target specification for amplitude and phase were identical to FIG. 5. As can be seen, a phase error of 31.6° and an amplitude error of 3.5 dB remain. The time characteristic of the voltages shown in FIG. 9 also presents considerable deviations from the desired differential-mode signal.

Figure 10A:
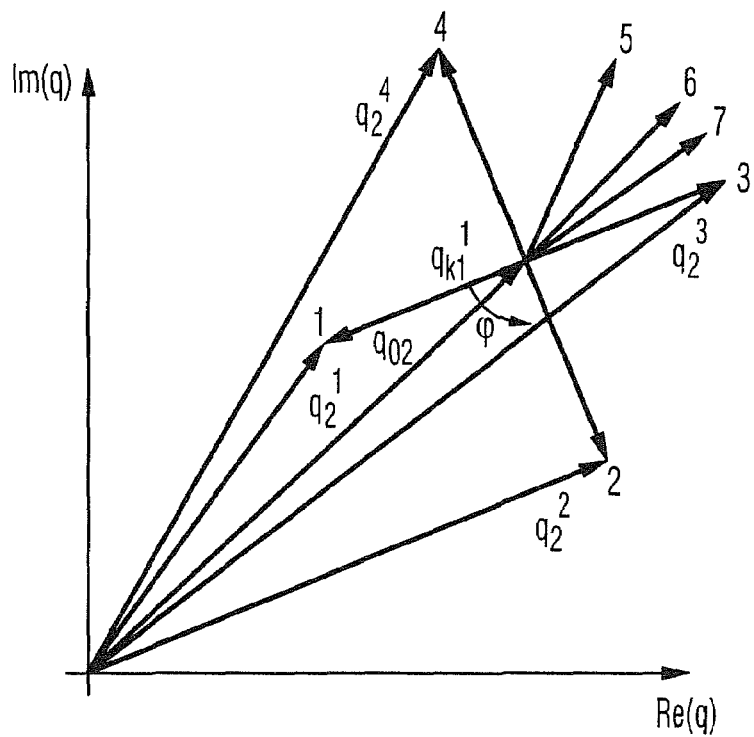
FIG. 10 shows the determination of the modulus maximum of $q_2$.
Figure 10B:
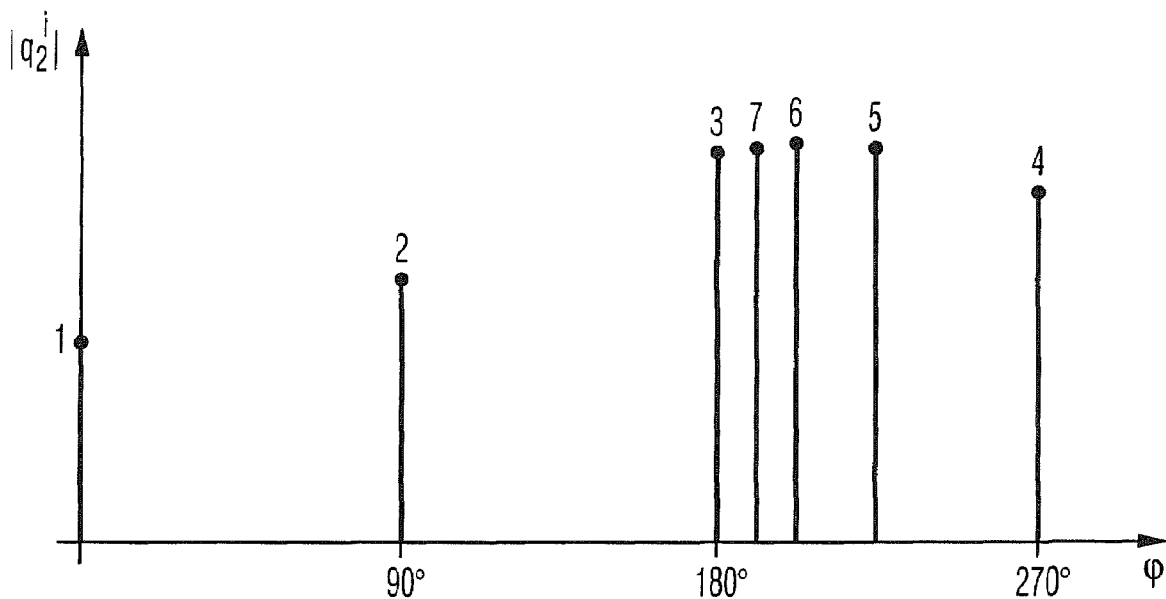

For coupled parameters, the relationship between the desired values $A_w$, $\Delta\phi_w$ and the amplitude and phase change of the original parameter $q_{01}$ required for these is not so directly evident as for uncoupled parameters. In order to calculate the required change of $q_{01}$, the moduli and relative phases of the partial vectors $q_{01}$ and $q_{ki}$ must be known. However, only the sum vectors $q_1$ and $q_2$ can be measured directly. One possible method for determining the vectors $q_{01}$ and $q_{02}$ can be broken down into the following stages:

1. Starting from an initial condition I with arbitrary and unknown relative-phase position of the vectors $q_{02}$ and $q_{k1}$, the phase $\phi_{01}$ of the original parameter $q_{01}$ is adjusted in such a manner that the modulus of the sum vector $q_2$ adopts the maximum value $|q2|_{max}$ in the intermediate condition II. One possible procedure can be explained with reference to FIG. 10. The phase of the over-coupling partial vector $q_{ki}$ differs from $\phi_{01}$ only by a constant angular difference. The quadrant of the maximum can be determined with 4 measurements 1 . . . 4, wherein $q_{k1}$ is rotated respectively in steps of 90° to $q_{k1}^{<1>}$ . . . $q_{k1}^{<4>}$. The exact phase $\phi_{01m}$ of the modulus maximum can then be determined within this quadrant, via an interval nesting. The vectors $q_{02}$, $q_{k1}^i$ and the resulting $q_2^i$ are entered in FIG. 10a; the measured modulus values $|q_2^i|$ are entered in FIG. 10b for 7 measurements, of which 4 are quadrant measurements and 3 are iterative steps. If $q_{01}$ is rotated starting from condition II of the modulus maximum $|q_2|_{max}$ through 180°, the modulus minimum $|q_2|_{min}$ is obtained. Accordingly, the modulus values for the partial vectors of $q_2$ can be determined as follows:

$$|q_{02}| = \frac{(|q_2|)_{max} + (|q_2|)_{min}}{2}$$

$$|q_{k1}| = \frac{(|q_2|)_{max} - (|q_2|)_{min}}{2}$$

Following this, condition II is restored by a further rotation through 180°.

2. The search for condition III, in which $|q_1|$ is maximal, is implemented according to the same method. In this context, the changes of $\phi_{01}$ are summated, thereby leading to the phase difference $\Delta\phi_{01m}$ relative to the condition II. In condition III, the moduli of the partial vectors of $q_1$ can be determined—once again using a 180° phase offset:

$$|q_{01}| = \frac{(|q_1|)_{max} + (|q_1|)_{min}}{2} \quad (16)$$

$$|q_{k2}| = \frac{(|q_1|)_{max} - (|q_1|)_{min}}{2} \quad (17)$$

Figure 11A:
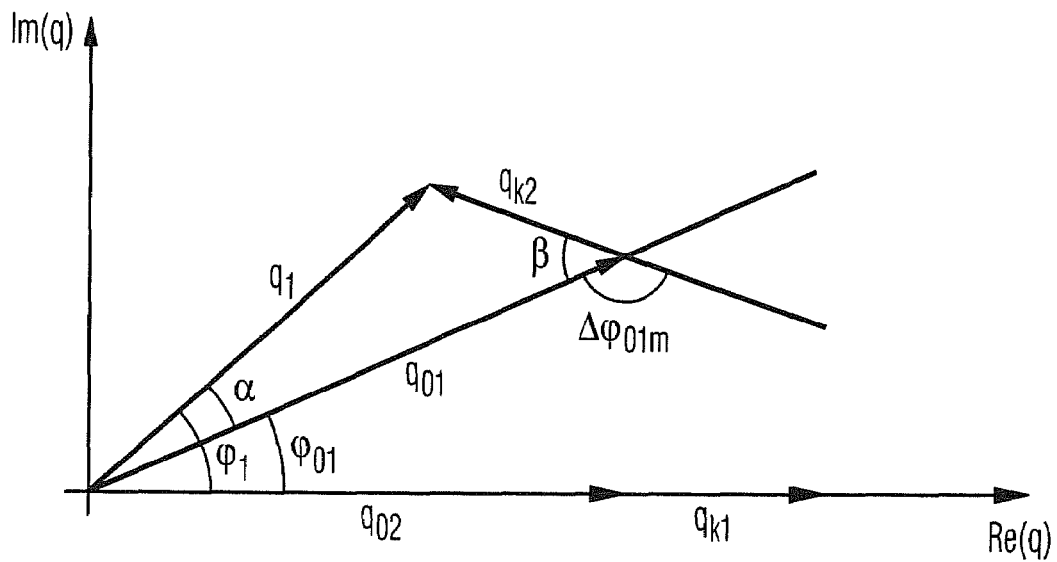
FIG. 11 shows the determination of the relative phases of $q_{01}$ and $q_{k2}$ in condition II.
Figure 11B:
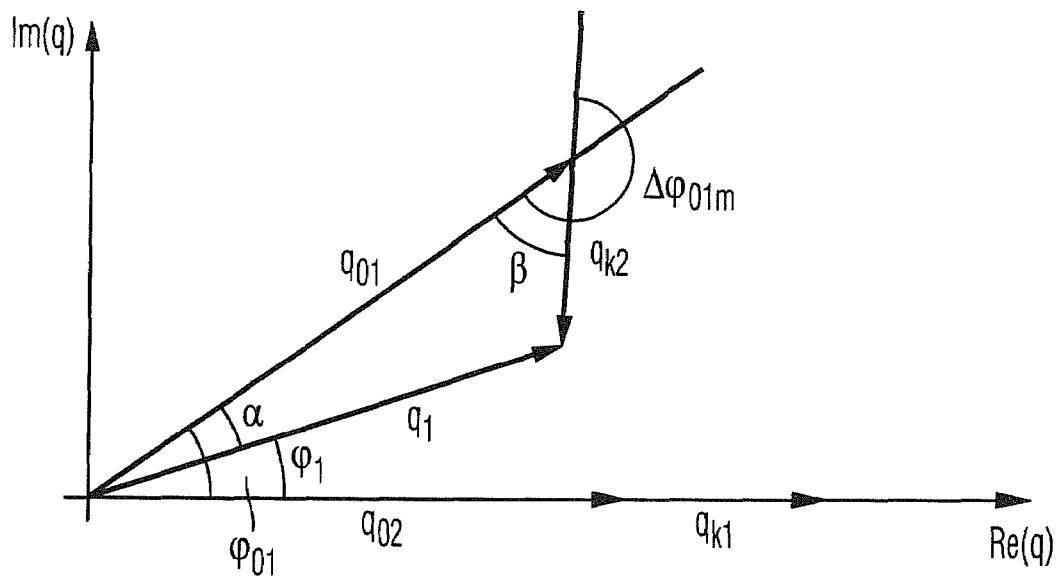

3. The still-required relative phases of the partial vectors relative to one another need to be determined only for an arbitrary superposition condition. Since $q_{01}$ and $q_{k1}$ are phase-coupled, all other possible conditions can also be calculated. Condition II is appropriate for the determination of the phase, because the phase difference between $q_{02}$ and $q_{k1}$ is 0° at the maximum of $|q_2|$ and is therefore already known. The partial vectors are illustrated in FIG. 11. Absolute phases are not relevant, and accordingly $\phi_{02}=\phi_{k2}=0°$ can be set. $\Delta\phi_{01m}$ from the first stage is the angle through which $q_{01}$ must be rotated in the positive direction in order to point in the same direction as $q_{k2}$. Under this condition, $|q_1|$ becomes a maximum. $\Delta\phi_{01m}$ can either be smaller than 180°, as presented in FIG. 11a, or larger than 180°, as presented in FIG. 11b. The angle β in the triangle formed between $q_1$, $q_{01}$ and $q_{k2}$ is 180°−$\Delta\phi_{01m}$ in case a); and $\Delta\phi_{01m}$−180° in case b). Since the moduli of the vectors $q_1$, $q_{01}$ and $q_{k2}$ are known from the measurement or respectively from the first stage, the angle α of the triangle between $q_1$ and $q_{01}$ can also be calculated using the sine rule:

$$\alpha = \arcsin\left(\frac{|q_{k2}|}{|q_1|} \cdot \sin(\beta)\right) \quad (18)$$

If the angle α is considered as the signed phase difference $\alpha=\phi_1-\phi_{01}$, its value in case b) is negative. If no case-distinction is to be introduced, (18) will require a similarly-negative β. This can be achieved with the generally-valid statement $$\beta = 180° - \Delta\phi_{01m} \quad (19)$$

For the phases of the partial vectors $q_{01}$ and $q_{k2}$ still required, the following relationships apply:

$$\phi_{01} = \phi_1 - \alpha$$

$$\phi_{k2} = \phi_{01} \times \phi_{01m}$$

Accordingly, all of the partial vectors $q_{0i}$ and $q_{ki}$ have been determined with reference to modulus and phase.

The remaining task is now to determine for the vector $q_{01}$ the amplitude factor $c_{01}$ and the phase change $\Delta\phi_{01}$, according to which the condition:

$$q_{2w} = A_w \cdot e^{j \cdot \Delta\phi_w} \cdot q_{1w} \quad (20)$$

obtained by combining (12) and (13) is fulfilled. $c_{01}$ and $\Delta\phi_{01}$ act on the over-coupling value $q_{k1}$ in the same manner as on $q_{01}$, so that—starting from the starting condition I—the following can be stated with regard to $q_{1w}$ and $q_{2w}$:

$$q_{1w} = c_{01} \cdot e^{j \cdot \Delta\phi_{01}} \cdot q_{01I} + q_{k2I} \quad (21)$$

$$q_{2w} = q_{02I} + c_{01} \cdot e^{j \cdot \Delta\phi_{01}} \cdot q_{k1I} \quad (22)$$

The index I is omitted in the paragraphs below for reasons of simplicity. By substituting (21) and (22) in (20), the following is obtained:

$$q_{02} + c_{01} \cdot e^{j \cdot \Delta\phi_{01}} \cdot q_{k1} = A_w \cdot e^{j \cdot \Delta\phi_w} \cdot (c_{01} \cdot e^{j \cdot \Delta\phi_{01}} \cdot q_{01} + q_{k2}) \quad (23)$$

A scalar equation can be formulated in each case for the real and imaginary part of the complex equation (23). With the following substitutions:

$$A = A_w \cdot (\sin(\Delta\phi_w) \cdot Im(q_{01}) - \cos(\Delta\phi_w) \cdot Re(q_{01})) + Re(q_{k1})$$

$$B = A_w \cdot (\cos(\Delta\phi_w) \cdot Im(q_{01}) + \sin(\Delta\phi_w) \cdot Re(q_{01})) - Im(q_{k1})$$

$$C = A_w \cdot (\cos(\Delta\phi_w) \cdot Re(q_{k2}) - \sin(\Delta\phi_w) \cdot Im(q_{k2})) - Re(q_{02})$$

$$D = A_w \cdot (\cos(\Delta\phi_w) \cdot Im(q_{k2}) + \sin(\Delta\phi_w) \cdot Re(q_{k2})) - Im(q_{02})$$

these two scalar equations can be resolved to give the required $c_{01}$:

$$c_{01} = \frac{C}{\cos(\Delta\phi_{01}) \cdot A + \sin(\Delta\phi_{01}) \cdot B} \quad (24)$$

$$c_{01} = \frac{D}{-\cos(\Delta\phi_{01}) \cdot B + \sin(\Delta\phi_{01}) \cdot A} \quad (25)$$

$c_{01}$ is eliminated by equating (24) and (25), and a relationship is obtained for the similarly required $\Delta\phi_{01}$:

$$\tan(\Delta\phi_{01}) = \frac{\dfrac{A}{C} + \dfrac{B}{D}}{\dfrac{A}{D} - \dfrac{B}{C}} = \frac{A \cdot D + B \cdot C}{A \cdot C - B \cdot D} \quad (26)$$

$c_{01}$ can also be determined with (24) or (25). Reference must be made to the fact that (26) provides two solutions for $\Delta\phi_{01}$, which differ from one another by 180°. However, consideration of (24) and (25) shows that $\Delta\phi_{01}$ and $-\Delta\phi_{01}$ lead to solutions for $c_{01}$, which also differ only in their sign, that is to say, both solutions are equivalent. The adjustment of $c_{01}$ and $\Delta\phi_{01}$ at the source 401 is referred to below as the main correction.

With a real VNA, nonlinearities can occur in the adjustment of generator level and generator phase. Moreover, the change in the attenuation of the level-adjustment element often also brings about a phase change in the generator signal. It must therefore be taken into consideration that, after the main correction, the generator signal still does not yet completely fulfill the requirements. However, if the deviations are slight, a further improvement can be achieved by means of a linearised follow-on correction. The cost in measurement and therefore also the cost in time for this follow-on correction is considerably less than if a further, iterative main-correction stage were to be carried out.

With the total differentials of $|q_1|$, $|q_2|$, $\phi_1$ and $\phi_2$ after the amplitude change $\Delta q_{01}$ and the phase change $\Delta\phi_{01}$, linear interference terms for these parameters can be substituted into the equations (12) and (13). The following equation system is obtained:

$$\begin{pmatrix} A_w \cdot D_{11} - D_{21} & A_w \cdot D_{12} - D_{22} \\ D_{13} - D_{23} & D_{14} - D_{24} \end{pmatrix} \cdot \begin{pmatrix} \Delta q_{01} \\ \Delta\phi_{01} \end{pmatrix} = \begin{pmatrix} |q_2| - A_w \cdot |q_1| \\ \phi_2 - \phi_1 - \Delta\phi_w \end{pmatrix} \quad (27)$$

In equation (27), $|q_1|$, $|q_2|$, $\phi_1$ and $\phi_2$ denote the values obtained after the main correction. In order to indicate the partial derivations $D_{ij}$ of these values according to $|q_{01}|$ and respectively $\phi_{01}$, the values $|q_1|$, $|q_2|$, $\phi_1$ and $\phi_2$ must first be presented as functions of $|q_{01}|$ and respectively $\phi_{01}$.

Figure 12A:
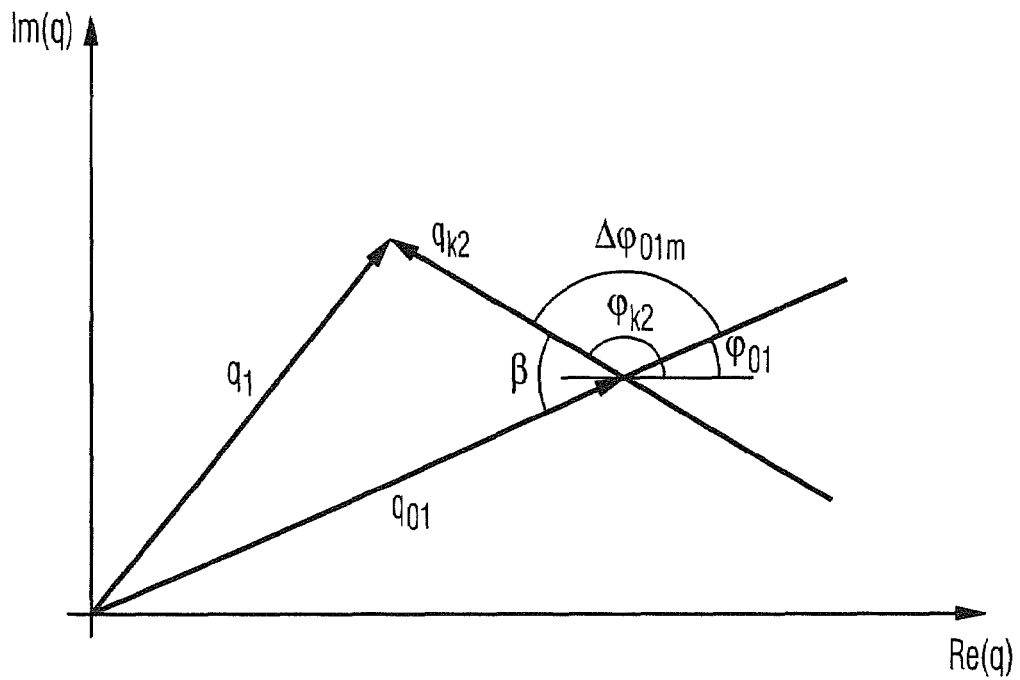
FIG. 12 shows the determination of the angle $\beta$.
Figure 12B:
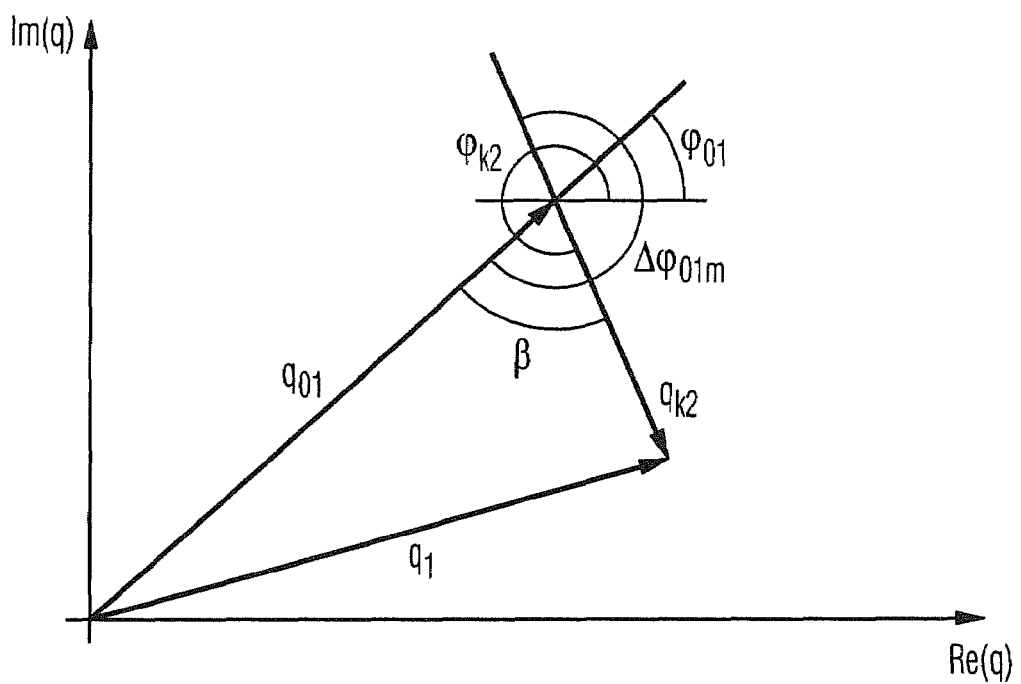

In view of the cosine rule, the following applies for $|q_1|$ (see FIG. 12):

$$|q_1| = \sqrt{(|q_{01}|)^2 + (|q_{k2}|)^2 - 2 \cdot |q_{01}| \cdot |q_{k2}| \cdot \cos(\beta)} \quad (28)$$

If the angular relationship $$\Delta\phi_{01m} = \phi_{k2} - \phi_{01}$$

shown in equations (12a) and (12b) is substituted in (19), equation (28) is transformed to give $$|q_1| = \sqrt{(|q_{01}|)^2 + (|q_{k2}|)^2 - 2 \cdot |q_{01}| \cdot |q_{k2}| \cdot \cos(\pi - \phi_{k2} + \phi_{01})} \quad (29)$$

The following applies for the phase of $q_1$:

$$\phi_1 = \mathrm{atan}\left( \frac{|q_{01}| \cdot \sin(\phi_{01}) + |q_{k2}| \cdot \sin(\phi_{k2})}{|q_{01}| \cdot \cos(\phi_{01}) + |q_{k2}| \cdot \cos(\phi_{k2})} \right) \quad (30)$$

Accordingly, the following equations are obtained for the modulus and phase of $q_2$:

$$|q_2| = \sqrt{(|q_{02}|)^2 + (|q_{k1}|)^2 - 2 \cdot |q_{02}| \cdot |q_{k1}| \cdot \cos(\pi - \phi_{k1} + \phi_{02})} \quad (31)$$

$$\phi_2 = \mathrm{atan}\left( \frac{|q_{02}| \cdot \sin(\phi_{02}) + |q_{k1}| \cdot \sin(\phi_{k1})}{|q_{02}| \cdot \cos(\phi_{02}) + |q_{k1}| \cdot \cos(\phi_{k1})} \right) \quad (32)$$

The partial derivations $D_{ij}$ can now be calculated from (29) ... (32):

$$D_{11} = \frac{|q_{01}| - |q_{k2}| \cdot \cos(\phi_{01} - \phi_{k2} - \pi)}{|q_1|}$$

$$D_{12} = \frac{|q_{01}| \cdot |q_{k2}| \cdot \sin(\phi_{01} - \phi_{k2} - \pi)}{|q_1|}$$

$$D_{13} = \frac{N_1 \cdot \sin(\phi_{01}) - Z_1 \cdot \cos(\phi_{01})}{N_1^2 + Z_1^2}$$

$$D_{14} = |q_{01}| \cdot \frac{N_1 \cdot \cos(\phi_{01}) + Z_1 \cdot \sin(\phi_{01})}{N_1^2 + Z_1^2}$$

$$D_{21} = \frac{|q_{k1}|}{|q_{01}|} \cdot \frac{|q_{k1}| - |q_{02}| \cdot \cos(\phi_{02} - \phi_{k1} - \pi)}{|q_2|}$$

$$D_{22} = -\frac{|q_{02}| \cdot |q_{k1}| \cdot \sin(\phi_{02} - \phi_{k1} - \pi)}{|q_2|}$$

$$D_{23} = \frac{|q_{k1}|}{|q_{01}|} \cdot \frac{N_2 \cdot \sin(\phi_{k1}) - Z_2 \cdot \cos(\phi_{k1})}{N_2^2 + Z_2^2}$$

$$D_{24} = |q_{k1}| \cdot \frac{N_2 \cdot \cos(\phi_{k1}) + Z_2 \cdot \sin(\phi_{k1})}{N_2^2 + Z_2^2}$$

Equation (27) can be resolved, for example, using the matrix inversion for the required follow-on correction values $\Delta q_{01}$ $\Delta\phi_{01}$. If the desired amplitude and phase condition for a follow-on correction stage has still not been fulfilled adequately, several follow-on correction stages can be implemented iteratively.

Figure 13:
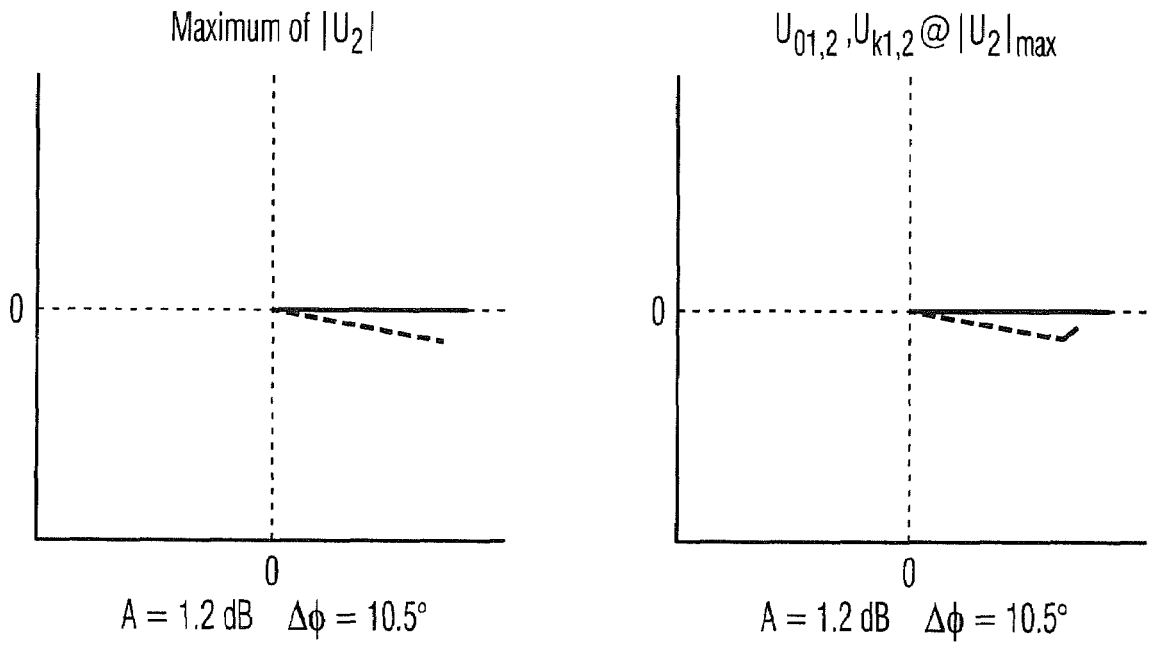
FIG. 13 shows the phasor of the unbalanced voltages of a DOHFSS coupled via a signal divider before and after the main correction and after one follow-on correction stage.
Figure 13:
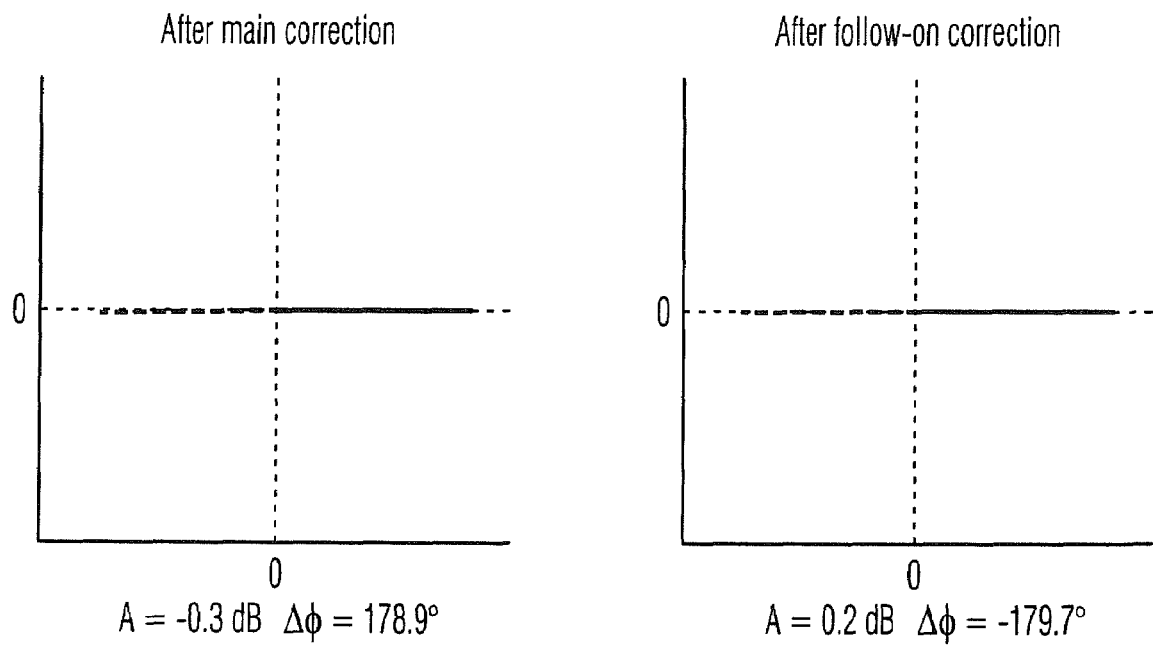
Figure 14:
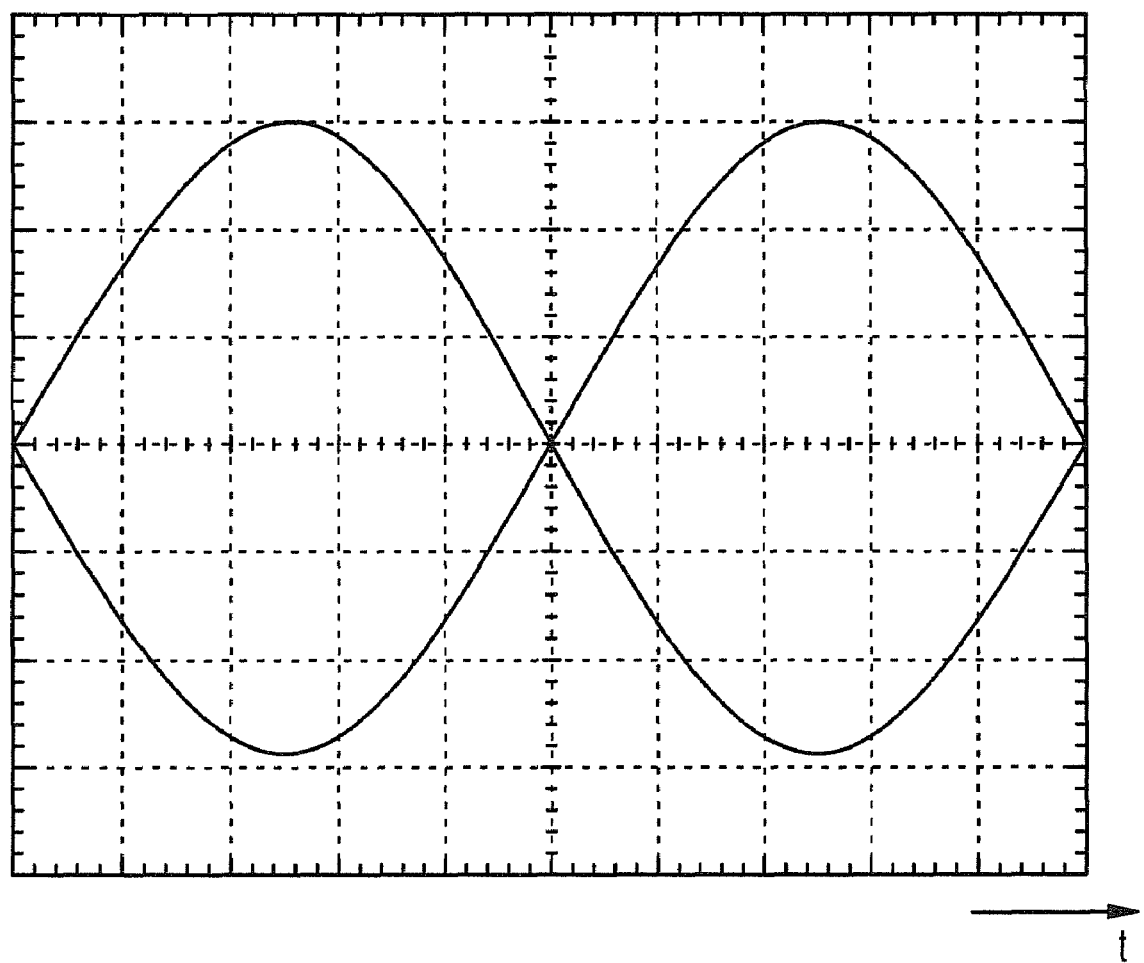
FIG. 14 shows the time characteristic of the unbalanced voltages of a DOHFSS coupled via a signal divider after one follow-on correction stage.

FIG. 13 shows the measured phasors for the unbalanced voltages $U_1$ and $U_2$ of a DOHFSS coupled via a signal divider before the correction (sum vectors and subdivision into partial vectors), after the main correction and after the follow-on correction. The marginal conditions, that is to say, signal frequency, amplitude, phase specification and coupling of the DOHFSS via a signal divider, are the same as for FIG. 8; however, at 0.2 dB in amplitude and 0.3° in phase, the deviation is significantly lower than in that context. This is also evident from the measured time characteristic of the voltages $U_1$, $U_2$ in FIG. 14.

The first part of the measurement task consisting in the determination of the mixed-mode S-matrix $S_M$ is completed by generating a pure differential-mode and respectively common-mode stimulus signal. However, a calculation of $S_M$ from the measured values determined with these stimulus signals is still required. Let the m unbalanced ports of the device under test be assigned to n logical ports, wherein a logical port can be balanced or unbalanced. In every case, $n \leq m$. The following applies for the matrix $S_M$:

$$\vec{b}_M = S_M \vec{a}_M \quad (33)$$

Wherein the vectors $\vec{b}_M$ of the waves reflected from the device under test and $\vec{a}_M$ of the waves travelling towards the device under test are mixed-mode waves, that is to say, they can contain unbalanced waves as well as differential-mode and common-mode waves. The unbalanced, system-error-corrected waves are given by equations (6) to (9). For the incident and reflected differential-mode waves of a balanced port consisting of the unbalanced ports j, k=1 ... m with the index i=1 ... n, the following apply:

$$a_{id} = \frac{1}{\sqrt{2}} \cdot (a_j - a_k)$$

-continued $$b_{id} = \frac{1}{\sqrt{2}} \cdot (b_j - b_k)$$

and for the common-mode waves, the following apply:

$$a_{ic} = \frac{1}{\sqrt{2}} \cdot (a_j + a_k)$$

$$b_{ic} = \frac{1}{\sqrt{2}} \cdot (b_j + b_k)$$

System-error-corrected wave vectors $\vec{a}_{Mp}$ and $\vec{b}_{Mp}$ can be measured for a given stimulus condition p, in which generator signals (unbalanced, common-mode or differential-mode) are applied to one or more logical test ports corresponding to the port type. m corrected wave vectors are obtained from m different stimulus conditions, wherein each port must be stimulated at least once with each wave mode associated with this port. In the simplest case, precisely one wave mode is stimulated at one port in each stimulus condition. If the vectors $\vec{a}_{Mp}$ and $\vec{b}_{Mp}$ are arranged in matrices:

$$A_M = (\vec{a}_{M1} \vec{a}_{M2} \ldots \vec{a}_{Mm})\ B_M = (\vec{b}_{M1} \vec{b}_{M2} \ldots \vec{b}_{Mm})$$

the following is obtained with equation (33):

$$B_M = S_M \cdot A_M$$

Finally, the required matrix $S_M$ can be calculated from this as follows:

$$S_M = B_M \cdot A_M^{-1}$$

The invention is not restricted to the exemplary embodiment described. Apart from the voltage, other object parameters can be used. All of the features described can be combined with one another as required within the framework of the invention.

The invention claimed is:

1. A method for the excitation and measurement of port groups of a multi-port device under test using a vectorial network analyzer, wherein the port groups are excited with coherent incident waves of the same frequency, which provide desired amplitude ratios and phase differences within each port group, wherein the network analyzer has unbalanced test ports, wherein the multi-port device under test is connected directly to the unbalanced test ports of the vectorial network analyzer, and wherein the waves are generated respectively by one signal generator of the vectorial network analyzer per test port, the method comprising,
   implementing a system-error correction of the unbalanced incident and reflected waves with reference to the ports of the device under test in order to obtain corrected waves, and
   calculating the amplitude and phase changes required in the signal generators to fulfill the desired amplitude and phase conditions from these corrected waves.

2. The method according to claim 1,
   wherein the phase change is implemented by offsetting the frequency of at least one signal generator by a defined step width during a defined time interval.

3. The method according to claim 2,
   wherein the test ports of the network analyzer are not coupled to one another via the device under test, so that the necessary amplitude and phase changes of the signal generators correspond directly to the deviations of the amplitudes and phases of the unbalanced waves travelling towards the device under test from the desired amplitudes and phases.

4. The method according to claim 2,
   wherein the test ports are coupled to one another at least within one port group of the device under test,
   wherein, for each incident, unbalanced wave associated with one port group, the components, of which the modulus and phase are dependent in each case only upon one of the signal generators assigned to the port group, are initially determined as partial vectors, and
   wherein the amplitude and phase changes necessary as a whole to fulfill the desired amplitude and phase conditions for all of the signal generators assigned to the port group are calculated from these partial vectors in each case as an overall vector.

5. The method according to claim 2,
   wherein the procedural stages are repeated iteratively.

6. The method according to claim 1,
   wherein the test ports of the network analyzer are not coupled to one another via the device under test, so that the necessary amplitude and phase changes of the signal generators correspond directly to the deviations of the amplitudes and phases of the unbalanced waves travelling towards the device under test from the desired amplitudes and phases.

7. The method according to claim 6,
   wherein the test ports are coupled to one another at least within one port group of the device under test,
   wherein, for each incident, unbalanced wave associated with one port group, the components, of which the modulus and phase are dependent in each case only upon one of the signal generators assigned to the port group, are initially determined as partial vectors, and
   wherein the amplitude and phase changes necessary as a whole to fulfill the desired amplitude and phase conditions for all of the signal generators assigned to the port group are calculated from these partial vectors in each case as an overall vector.

8. The method according to claim 6,
   wherein the procedural stages are repeated iteratively.

9. The method according to claim 1,
   wherein the test ports are coupled to one another at least within one port group of the device under test,
   wherein, for each incident, unbalanced wave associated with one port group, the components, of which the modulus and phase are dependent in each case only upon one of the signal generators assigned to the port group, are initially determined as partial vectors, and
   wherein the amplitude and phase changes necessary as a whole to fulfill the desired amplitude and phase conditions for all of the signal generators assigned to the port group are calculated from these partial vectors in each case as an overall vector.

10. The method according to claim 9,
    wherein a port group consists of two unbalanced ports i and j of the device under test and, in order to determine the partial vectors, the phase $\phi_i$ of the signal generator of port i is rotated relative to that of port j in such a manner that, for a first phase adjustment, the modulus $|a_i|$ of the incident wave $a_i$ of port i becomes maximal, and for a second phase adjustment, the modulus $|a_j|$ of the incident wave $a_j$ of port j becomes maximal, and
    wherein, in both phase adjustments, $\phi_i$ is rotated through 180°, so that the respective modulus $|a_i|$ or $|a_j|$ becomes minimal, and accordingly, the moduli of the partial vectors are determined from the maxima and minima of $|a_i|$ and $|a_j|$, and their phases are determined from the phase difference between the two adjustments.

11. The method according to claim 9,
wherein the accuracy of the determined solution is improved by linearization dependent upon the amplitudes and phases of the signal generators and by variation using linear interference terms.

12. The method according to claim 10,
wherein the accuracy of the determined solution is improved by linearization dependent upon the amplitudes and phases of the signal generators and by variation using linear interference terms.

13. The method according to claim 1,
wherein the procedural stages are repeated iteratively.

14. The method according to claim 1,
wherein the physical parameters, for which the defined amplitude and phase conditions apply, are voltages of the waves travelling towards the device under test.

15. The method according to claim 1,
wherein the port groups each comprise one port or two ports, and the defined amplitude and phase conditions in the case of a two-port group with two ports are those of a common-mode signal or a differential-mode signal or a linear combination thereof.

16. The method according to claim 1,
wherein a multi-port device under test providing m unbalanced ports is excited with m different stimulus conditions,
wherein each port group comprising p unbalanced ports is excited respectively with p different stimulus conditions, and
wherein the p incident waves or voltages of this port group provide different relative amplitude and phase relationships in each stimulus condition.

17. The method according to claim 16,
wherein the p different stimulus conditions of a port group p correspond to different modes, so that a total of m modes is obtained across all port groups,
wherein each electrical operating condition of the m-port is unambiguously described by m-dimensional vectors of the incident and reflected waves of these modes, and
wherein, after supplying the multi-port device under test with a total of m different stimulus conditions, the resulting m incident-wave vectors are combined in a first m*m-matrix, and the m reflected-wave vectors are combined in a second m*m-matrix, and, the mixed-mode scattering matrix of the multi-port device under test is obtained from an operation comprising both matrices.

18. The method according to claim 1,
wherein a multi-port device under test providing m unbalanced ports is excited with m different stimulus conditions,
wherein the signals of the signal generators in these conditions are combinations of unbalanced differential-modes and/or common-modes, and wherein each single-port group with only one test port is excited with one unbalanced signal in at least one condition, and each two-port group with two test ports is excited with a differential-mode signal in at least one condition and with a common-mode signal in at least one condition.

19. The method according to claim 18,
wherein, in order to determine a mixed-mode-matrix of the multi-port device under test from the unbalanced, system-error-corrected, incident and reflected waves corresponding to the arrangement of unbalanced and balanced ports in the multi-port device under test, the vectors of the incident and reflected waves are formed from unbalanced, differential-mode waves and/or common-mode waves; these are arranged respectively in matrices; and the mixed-mode matrix is calculated from these matrices.

20. A method comprising:
exciting port groups of a multi-port device under test with coherent incident waves of a same frequency, which provide desired amplitude ratios and phase differences within each port group, wherein the waves are generated respectively by one signal generator of a vectorial network analyzer per test port, and wherein the network analyzer has unbalanced test ports; and
implementing a system-error correction of unbalanced incident and reflected waves with reference to the ports of the device under test in order to obtain corrected waves,
wherein amplitude and phase changes required in the signal generators to fulfill desired amplitude and phase conditions are calculated from the corrected waves.

* * * * *